United States Patent [19]

Mack et al.

[11] Patent Number: 5,045,429
[45] Date of Patent: Sep. 3, 1991

[54] LIGHT-SENSITIVE PHOTOPOLYMERIZABLE AND DIAZONIUM RESIN CONTAINING COMPOSITION AND RECORDING MATERIAL INCLUDING REACTION PRODUCT OF ANHYDRIDE WITH CARBOXYLIC ACID AND VINYL ALCOHOL

[75] Inventors: Gerhard Mack; Georg Pawlowski, both of Wiesbaden, Fed. Rep. of Germany

[73] Assignee: Hoechst Aktiengesellschaft, Frankfurt am Main, Fed. Rep. of Germany

[21] Appl. No.: 560,284

[22] Filed: Jul. 30, 1990

Related U.S. Application Data

[63] Continuation of Ser. No. 214,890, Jun. 29, 1988, abandoned, which is a continuation of Ser. No. 891,888, Aug. 1, 1986, abandoned.

[30] Foreign Application Priority Data

Aug. 7, 1985 [DE] Fed. Rep. of Germany ....... 3528309

[51] Int. Cl.$^5$ .................... G03F 7/021; G03F 7/033; G03F 7/032
[52] U.S. Cl. .................... 430/175; 430/176; 430/281
[58] Field of Search .................... 430/175, 176, 281

[56] References Cited

U.S. PATENT DOCUMENTS

| | | | |
|---|---|---|---|
| 3,989,610 | 11/1976 | Tsukada et al. | 204/159.15 |
| 4,171,974 | 10/1979 | Golda et al. | 96/75 |
| 4,289,838 | 9/1981 | Rowe et al. | 430/163 |
| 4,387,151 | 6/1983 | Bosse et al. | 430/175 |
| 4,631,245 | 12/1986 | Pawlowski | 430/175 |
| 4,659,645 | 4/1987 | Frommeld et al. | 430/176 |
| 4,661,432 | 4/1987 | Lutz et al. | 430/175 |

FOREIGN PATENT DOCUMENTS

| | | | |
|---|---|---|---|
| 1024803 | 1/1978 | Canada | 430/175 |
| 104863 | 4/1984 | European Pat. Off. | 430/175 |
| 1290727 | 9/1972 | United Kingdom . | |
| 1291970 | 10/1972 | United Kingdom . | |
| 1474073 | 5/1977 | United Kingdom . | |
| 2044788 | 5/1983 | United Kingdom | 430/175 |

Primary Examiner—Charles L. Bowers, Jr.
Attorney, Agent, or Firm—Foley & Lardner

[57] ABSTRACT

A light-sensitive mixture that contains as essential constituents (a) a diazonium salt polycondensation product, (b) a free-radical polymerizable compound, (c) a polymerization initiator which forms free radicals under the action of actinic radiation and (d) a water-insoluble polymeric binder which is soluble in organic solvents and in aqueous alkaline solutions, where the binder is a reaction product of an intramolecular anhydride of an organic polycarboxylic acid with a hydroxyl-containing synthetic polymer, is preferably used for preparing planographic printing plates which combine high image resolution and an extended print run.

14 Claims, No Drawings

LIGHT-SENSITIVE PHOTOPOLYMERIZABLE AND DIAZONIUM RESIN CONTAINING COMPOSITION AND RECORDING MATERIAL INCLUDING REACTION PRODUCT OF ANHYDRIDE WITH CARBOXYLIC ACID AND VINYL ALCOHOL

This application is a continuation of application Ser. No. 07/214,890, filed June 29, 1988, abandoned, which is a continuation of Ser. No. 06/891,888 filed Aug. 1, 1986 now abandoned.

BACKGROUND OF THE INVENTION

The present invention relates to a negative-working, light-sensitive mixture which contains a diazonium salt condensation product, a polymerizable compound, a photoinitiator and a binder, and to a recording material prepared from the mixture, which recording material is particularly suitable for preparing planographic printing plates.

Combinations of photopolymerizable mixtures with negative-working diazo compounds, in particular diazonium salt polycondensation products, are known from German Offenlegungsschriften No. 2,361,931, No. 2,903,270 and No. 3,007,212 (corresponding to British patent application No. 2,044,788). In such mixtures the diazo compound itself acts as a photoinitiator for the polymerization of the monomer, or an additional photoinitiator is added. These mixtures are said to provide particular advantages of better copy resolution, compared with pure photopolymerizable layers, and an increased print run compared with layers that contain only diazo compounds as light-sensitive substances. Moreover, in certain cases it is possible to carry out the development with aqueous solutions or even with pure water.

A similar mixture which contains a binder having crosslinkable allyl side groups is described in European patent application No. 104,863. The advantage of this mixture is said to be, in particular, that the light sensitivity of recording materials prepared using the mixture has a lower temperature dependence. A further advantage is said to be the lower dependence of the light sensitivity on the time gap between exposure and development. But offset printing plates prepared from light-sensitive mixtures as disclosed by the European patent publication have the disadvantages of a relatively low run stability and an undesirably high dot gain during printing.

The examples of the European patent publication indicate that a light-sensitive layer normally has an additional oxygen barrier layer applied to it. This entails the disadvantages of an additional preparative operation and lower image resolution in the copy. In addition, a stronger dot gain is frequently observed as a consequence of halation. Without the oxygen barrier layer, the reciprocity of the layer is impaired and the light sensitivity is usually reduced; also, the light-sensitive layer itself has a stronger tackiness than the barrier layer.

U.S. Pat. No. 4,659,645 (priority date: July 10, 1984) describes a light-sensitive mixture comprising the above-mentioned constituents and, as the diazonium salt condensation product, a polycondensation product containing repeat units $AN_2X$ and B which are bonded to one another through intermediate moieties, preferably methylene groups. A denotes the radical of an aromatic diazonium compound which is condensable with formaldehyde, and B denotes the radical of a compound which is free of diazonium groups and condensable with formaldehyde. In particular, B is the radical of an aromatic amine, a phenol, a phenol ether, an aromatic thioether, an aromatic hydrocarbon, an aromatic heterocyclic compound or an organic acid amide.

Another U.S. Pat. No. 4,631,245 (priority date: February 8, 1984) describes a light-sensitive mixture, said to be particularly useful for preparing planographic printing plates, that contains a diazonium salt polycondensation product of the composition mentioned in the preceding paragraph and, as a binder, a reaction product of an intramolecular anhydride of an organic polycarboxylic acid with a hydroxyl-containing synthetic polymer. According to the application, the polymer should have no other functional groups that are capable of reacting with acid anhydrides.

SUMMARY OF THE INVENTION

It is an object of the present invention to provide a negative-working, light-sensitive mixture which provides the advantages of known photopolymerizable mixtures containing diazonium salt condensation products and, in addition, can be used to produce high-resolution copies and planographic printing plates displaying a low dot gain and high print runs, all without the necessity of an oxygen-barrier layer.

It is also an object of the present invention to provide a light-sensitive recording material with which high-resolution copying can be achieved without sacrificing print-run stability and without excessive dot gain.

In accomplishing the foregoing objects, there has been provided, in accordance with one aspect of the present invention, a light-sensitive mixture comprising (a) a diazonium salt polycondensation product, (b) a free-radically polymerizable compound having at least two terminal, ethylenically-unsaturated groups and a boiling point at atmospheric pressure above 100° C., (c) a polymerization initiator which forms free radicals under the action of actinic radiation and (d) a water insoluble polymeric binder which is soluble in organic solvents and in aqueous alkaline solutions, wherein the binder is a reaction product of (i) an intramolecular anhydride of an organic polycarboxylic acid and (ii) a hydroxyl-containing synthetic polymer that comprises no other functional groups capable of reaction with acid anhydrides.

There has also been provided, in accordance with another aspect of the present invention, a light-sensitive recording material comprising a base material and a light-sensitive layer applied to the base material, wherein the light-sensitive mixture is comprised of the above-described mixture.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF PREFERRED EMBODIMENTS

Suitable diazonium salt polycondensation products for use in the present invention are condensation products of condensable aromatic diazonium salts, for example, diphenylamine-4-diazonium salts, with aldehydes, preferably formaldehyde. It is especially advantageous to use co-condensation products which, in addition to the diazonium salt units, also contain other, light-insensitive units that are derived from condensable compounds, in particular aromatic amines, phenols, phenol ethers, aromatic thioethers, aromatic hydrocarbons, aromatic heterocycles and organic acid amides. These condensation products are described in German Patentschrift No. 2,024,244. In general, any diazonium salt polycondensation product described in German Offenlegungsschrift No. 2,739,774 is suitable. The diazonium salt units $A-N_2X$ are preferably derived from compounds of the formula $(R^8-R^9-)_p R^{10}-N_2X$, where X denotes the anion of the diazonium compound, p denotes an integer from 1 to 3, $R^8$ denotes an aromatic radical having at least one position capable of condensation with active carbonyl compound, $R^{10}$ denotes a phenylene group, $R^9$ denotes a single bond or one of the following groups:

$$-(CH_2)_q-NR^{11}-,$$
$$-O-(CH_2)_r-NR^{11}-,$$
$$-S-(CH_2)_r-NR^{11}-,$$
$$-S-CH_2CO-NR^{11}-,$$
$$-O-R^{12}-O-,$$
$$-O-,$$
$$-S- \text{ or}$$
$$-CO-NR^{11}-$$

in which q is a number from 0 to 5, r is a number from 2 to 5, $R^{11}$ is hydrogen, an alkyl group of 1 to 5 carbon atoms, an aralkyl group of 7 to 12 carbon atoms or an aryl group of 6 to 12 carbon atoms, and $R^{12}$ is an arylene group of 6 to 12 carbon atoms.

Among the above-mentioned classes of compounds, preference is given to the condensation products of the diphenylamine-4-diazonium salts, which may be substituted by alkyl groups, alkoxy groups or halogen atoms. The preferred second components B are optionally substituted diphenyl ethers, diphenyl sulfides, diphenylmethanes and diphenyls. For the condensation process, it is particularly advantageous to use the bis-methoxymethyl, bis-hydroxymethyl or bis-acetoxymethyl derivatives of the basic structures. The condensation product can contain on average 0.1 to 50, preferably 0.2 to 20, units of B per unit of $A-N_2X$.

The amount of diazonium salt polycondensation product in the mixture is generally between 5 and 60% by weight, preferably between 10 and 40% by weight, based on the total amount of nonvolatile constituents.

Other particularly advantageous polycondensation products are obtained when an optionally substituted diphenylaminediazonium salt is condensed first with an aromatic compound $R'-O-CH_2-B$ and then with an aromatic compound $R'-O-CH_2-B-CH_2-O-R'$, where $R'$ is a hydrogen atom, an alkyl radical or an aliphatic acyl radical. These condensation products are described in European patent application No. 126,875.

The free radical polymerizable compounds used are preferably acrylic or methacrylic acid esters of polyhydric, in particular primary, alcohols. The alcohols can contain 2 to 6, preferably 2 to 4, OH groups. It is also possible for minor amounts of (meth)acrylic esters of monohydric alcohols to be present in the mixture. Examples of suitable esters are trimethylolpropane triacrylate, pentaerythritol triacrylate and tetraacrylate, dipentaerythritol hexamethacrylate, propylene glycol dimethacrylate, glycerol dimethacrylate, triethylene glycol dimethacrylate, polyethylene glycol diacrylate and bisacrylates of oxyethylated bisphenol-A derivatives. Also suitable are the low molecular weight, urethane group-containing acrylates and methacrylates obtained by reacting hydroxyalkyl acrylate or methacrylate with diisocyanates or polyisocyanates. The isocyanates can have been obtained by reacting diisocyanates with diols or triols to give oligomeric compounds. The amount of polymerizable compounds is generally between 10 and 65% by weight, preferably 30 to 60% by weight.

The photoinitiators used in the present invention can be selected from a large number of compounds, including where appropriate mixtures of two or more different, frequently synergistically acting compounds. Examples of suitable photoinitiators include benzoin and its derivatives; polynuclear quinones; acridine derivatives, for example, 9-phenyl-acridine, 9-p-methoxyphenylacridine, benz(a)acridine; phenazine derivatives, for example, 9,10-dimethylbenz(a)phenazine and 10-methoxybenz(a)phenazine; quinoxaline derivatives, for example, 6,4',4''-trimethoxy-2,3-diphenylquinoxaline, 4,4''-dimethoxy-2,3-diphenyl-5-azaquinoxaline; and aromatically substituted bistrichloromethyl-s-triazines and trichloromethyl-substituted carbonylmethyleneheterocycles, such as 2-(p-trichloromethyl-benzoylmethylene)-3-ethylbenzothiazoline. The trichloromethyl compounds are particularly preferred. The amount of photoinitiator in the present invention is generally between 0.05 and 10, preferably between 0.5 and 5%, by weight.

The binders contained in the mixture according to the present invention are described in the above-mentioned U.S. Pat. No. 4,631,245. The acid anhydride used for preparing the binders is preferably derived from a dicarboxylic or tricarboxylic acid, in particular a dicarboxylic acid, and can contain one, two, or more rings. Particularly preferred binders are obtained by reacting with acid anhydrides represented by one of the following formulas:

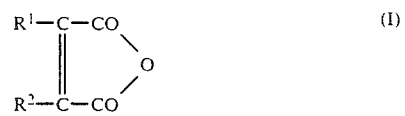  (I)

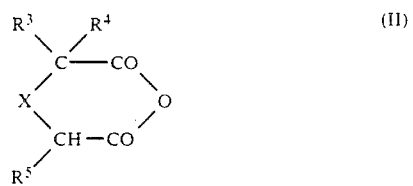  (II)

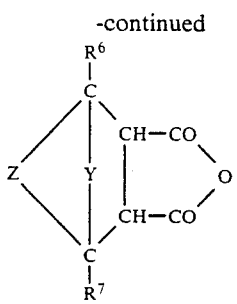

(III)

where
- $R^1$ and $R^2$ individually denote hydrogen atoms or alkyl groups or together are linked to form an aromatic or heteroaromatic, optionally substituted and optionally partially hydrogenate 5- or 6-membered ring onto which up to two aromatic or cycloaliphatic rings can be fused,
- $R^3$, $R^4$ and $R^5$ individually denote hydrogen atoms or alkyl groups or
- $R^3$ and $R^5$ together are linked to form an optionally substituted, saturated or unsaturated aliphatic ring which, including X, can have five or six ring members,
- $R^6$ and $R^7$ each denote a hydrogen atom or an alkyl group,
- X denotes a single bond, a group selected from a 1,1-alkylene group and a 1,1-cycloalkylene group, which group is optionally substituted, an oxygen atom or a sulfur atom,
- Y denotes an oxygen atom, a sulfur atom, a 1,1- or 1,2-alkylene group or a 1,2-alkenylene group onto which an aromatic or cycloaliphatic ring is optionally fused, and
- Z denotes the ring members required for completing a saturated or unsaturated, optionally substituted ring, where up to two aromatic or cycloaliphatic rings can be fused onto this ring.

When any of $R^1$, $R^2$, $R^3$, $R^4$, $R^5$, $R^6$ and $R^7$ denotes an alkyl group, these generally have 1 to 4, preferably 1 to 2, carbon atoms. Substituents which can be bonded to the aromatic or cycloaliphatic rings are, for example, alkyl groups, alkoxy groups, halogen atoms, nitro groups and carboxyl groups.

Examples of suitable acid anhydrides for use in the present invention include:
- maleic anhydride and derivatives, such as dimethylmaleic anhydride and citraconic anhydride;
- succinic anhydride and derivatives, such as methylsuccinic anhydride,
- glutaric anhydride and its derivatives, such as methylglutaric anhydride, 3,3-tetramethylene-glutaric anhydride and camphoric anhydride;
- 3-oxaglutaric anhydride and its derivatives;
- phthalic anhydride and related substitution products, such as chloro-, nitro- and carboxy-phthalic anhydride;
- partially or completely hydrogenated phthalic anhydrides, such as hexahydrophthalic anhydride and cyclohexene-1,2-dicarboxylic anhydride;
- naphthalene-2,3-dicarboxylic anhydride and naphthalene-1,8-dicarboxylic anhydride and substitution products thereof;
- pyridine-o-dicarboxylic anhydride and its substitution products;
- pyrazine-o-dicarboxylic anhydride and its substitution products;
- furan-o-dicarboxylic anhydride and furan-2,5-dicarboxylic anhydride, their substitution products and their partially or completely hydrogenated derivatives;
- thiophene-o-dicarboxylic anhydride and thiophene-2,5-dicarboxylic anhydride, their substitution products and their completely or partially hydrogenated derivatives;

and
- dicyclic and polycyclic anhydrides that are formed by Diels-Alder reaction of a diene with maleic anhydride, for example, the addition products of furan, anthracene, cyclohexa-1,3-diene or cyclopentadiene and maleic anhydride.

Preference is given to the reaction products with maleic, phthalic, succinic and 3-oxa-glutaric anhydride.

Suitable hydroxyl-containing synthetic polymers are, in particular, polymers having vinyl alcohol units, and epoxy resins and hydrolyzed epoxy resins, copolymers of allyl alcohol and higher unsaturated alcohols, polyhydroxyalkyl acrylates and methacrylates, and similar polymers. Suitable polymers with vinyl alcohol units are partially hydrolyzed polyvinyl esters, polyvinyl acetals having free hydroxyl groups and corresponding reaction products of copolymers comprising vinyl ester or vinyl acetal or vinyl alcohol units.

The molecular weight of the carboxyl-containing binders can vary within wide ranges. In general, binders having molecular weights between 5,000 and 200,000 or more, preferably between 10,000 and 100,000, are used. The acid number of the binders can generally be between 5 and 80, preferably between 10 and 70. The amount of binder is in general 5–80% by weight, preferably 10–50% by weight, based on the nonvolatile portions of a light-sensitive mixture.

The reaction between acid anhydride and hydroxyl-containing polymer can be carried out in ketones, for example butanone, or in tetrahydrofuran, dioxane and other ethers. The catalysts used are advantageously tertiary amines. In general, 0.5 to 20 parts by weight of anhydride, 1,000 to 3,000 parts by weight of solvent and 0.5 to 5 parts by weight of tertiary amine are used per 100 parts by weight of hydroxyl-containing polymer.

The mixtures according to the present invention can further contain acids, inhibitors for the thermopolymerization, dyes, pigments, levelling agents, plasticizers, wetting agents and other customary additives.

The mixtures are preferably used for preparing light-sensitive printing plates, in particular planographic printing plates. In this case the base materials used are predominantly metals, such as zinc, steel, chromed steel, brass/chromium, copper/chromium or aluminum. In the case of planographic printing plates it is preferred to use aluminum, in particular mechanically, chemically or electrolytically roughened aluminum which is preferably provided with an anodically generated oxide layer.

The mixtures of the present invention can also be used in photoresist technology, for example, for preparing letterpress, intaglio and multimetal printing plates, and for making printed circuits. In this use, the present invention often provides an increased resolution, compared with the commonly used photopolymerizable mixtures, which is a particular advantage.

In all uses, the advantages of the mixtures according to the present invention over the known mixtures based on a photopolymer/diazonium salt condensate are reflected in increased light sensitivity, increased storability and improved adhesion of a light-sensitive layer, particularly in the exposed state, prepared using the mixture.

The solvents used for preparing coating solutions in accordance with the present invention can be, depending on the layer constituents, alcohols, such as methanol and ethanol; glycol ethers, such as ethylene glycol monoethyl ether; dimethylformamide and diethylformamide; ethers, such as dioxane and tetrahydrofuran; esters such as ethyl acetate, butyl acetate, ethylene glycol methyl ether acetate; and ketones such as methyl ethyl ketone, cyclohexanone and the like.

The light-sensitive layer can be generated in a conventional manner by applying a solution of the layer constituents to the base material. It can also be applied to a temporary base material from which it is mechanically separable and can be transferred by laminating to the final base material, for example, a nickel foil or the copper layer of a printed circuit board base material.

In the course of processing, the recording material is exposed imagewise through a master. The light source used for image exposure can be any light source that is customary in reproduction technology and that emits in the long-wave UV region, for example, carbon arc lamps, mercury high pressure lamps, xenon pulsed lamps and others. Even electron and laser radiation is suitable for image recording.

The exposure is followed by development with a suitable developer. The developers that can be used include aqueous wetting agent solutions, in the presence or absence of alkali; their mixtures with organic solvents; aqueous salt solutions; aqueous solutions of acids, for example, of phosphoric acid, to which in turn salts or organic solvents can be added; and aqueous-alkaline developers, for example, aqueous solutions of sodium salts of phosphoric acid or of silicic acid. These developers can likewise be admixed with organic solvents. It is in some cases even possible to use water-diluted organic solvents. The developers can additionally contain further constituents, for example, wetting agents and hydrophilizing agents.

Development is effected in the known way, for example, by dipping and/or wiping or spraying with the developer fluid, in the course of which the nonexposed areas of the layer are dissolved.

The developed printing plate can also be postcured by heating to a temperature within the range of 150°–230° C. In general a time of 2 to 20 minutes is sufficient for the postcure. A further advantage is the possibility of postcuring by exposure or irradiation of the developed printing form. This type of posttreatment is significantly more effective, in the case of a printing plate comprised of the mixture according to the present invention, than in the case of a plate whose light-sensitive layer only comprises a photopolymerizable mixture. The latter plate requires a very high energy consumption for complete curing by the postexposure without master and without oxygen-blocking top layer, that is, in the presence of atmospheric oxygen.

The examples below describe the preparation of light-sensitive mixtures, and of the recording materials prepared with those mixtures, according to the present invention. In the examples, parts by weight (pbw) and parts by volume (pbv) relate to one another as g relates to ml. Percentages are by weight, unless otherwise stated, and temperatures are given in ° C.

Example 1

An aluminum sheet was electrochemically roughened and anodized and, to improve the hydrophilic character, subsequently treated with an aqueous solution of polyvinylphosphonic acid. This was followed by application of the following mixture in such an amount as to produce a dry weight of 18 g/m$^2$:

1.5 pbw of the reaction product of a polyvinyl butyral having a molecular weight of 70,000–80,000, which contains 71% by weight of vinylbutyral, 2% by weight of vinyl acetate and 27% by weight of vinyl alcohol units, with maleic anhydride (acid number of the product 30), 0.45 pbw of the diazonium salt polycondensation product of 1 mole of 3-methoxydiphenylamine-4-diazonium-sulfate and 1 mole of 4,4'-bismethoxmethyldiphenyl ether, precipitated as mesitylene sulfonate, 0.09 pbw of Viktoriareinblau FGA (C.I. Basic Blue 81), 1.5 pbw of pentaerythritol tetraacrylate/triacrylate (technical mixture), 0.12 pbw of 2-(4-styrl-phenyl)-4,6-bis-trichloromethyl-s-triazine and 0.04 pbw of phosphoric acid (85%) in 47.7 pbw of 2-methoxyethanol and 48.6 pbw of butanone.

The resulting printing plate was exposed under a test master and developed with the following developer solution.

0.2 pbw of sodium metasilicate x 9 H$_2$O, 3.9 pbw of disodium hydrogenphosphate x 12 H$_2$O, 3.5 pbw of trisodium phosphate x 12 H$_2$O, 1.5 pbw of potassium tetraborate x 4 H$_2$O and 2.9 pbw of sodium octylsulfate in 88.0 pbw of demineralized water.

With the completed printing form, 250,000 satisfactory prints were prepared in an offset printing machine. The printing form exhibited no noticeable damage.

Example 2

Base material and layer weight were as in Example 1. The coating solution used had the following composition:

1.5 pbw of the reaction product of the polyvinyl butyral indicated in Example 1 and phthalic anhydride (acid number 45), 0.45 pbw of the diazonium salt condensation product of Example 1, 0.09 pbw of Viktoriareinblau FGA, 1.5 pbw of the pentaerythritol ester indicated in Example 1, 1.12 pbw of the triazine indicated in Example 1 and 0.04 pbw of phosphoric acid (85%) in 47.7 pbw of 2-methoxyethanol and 48.6 pbw of butanone.

The imagewise exposed printing plate was developed with the developer solution of Example 1. A print run of 185,000 was obtained.

Example 3

With a solution comprising:

1.5 pbw of the polymeric binder indicated in Example 1, 0.88 pbw of the diazonium salt polycondensation product of Example 1, 0.09 pbw of Viktoriareinblau FGA, 1.68 pbw of the pentaerythritol ester of Example 1,
0.16 pbw of the triazine of Example 1 and
0.04 pbw of phosphoric acid (85%) in
47.65 pbw of 2-methoxyethanol and
48.0 pbw of butanone, a printing plate was prepared as described in Example 1. The print run obtained was 230,000.

Example 4

A solution comprising:
1.5 pbw of the polymeric binder indicated in Example 1,
0.88 pbw of a diazonium salt polycondensation product of 3-methoxydiphenylamine-4-diazonium sulfate and formaldehyde,
0.09 pbw of Viktoriareinblau FGA,
1.68 pbw of the pentaerythritol ester indicated in Example 1,
0.16 pbw of the triazine indicated in Example 1 and
0.04 pbw of phosphoric acid (85%) in
74 pbw of 2-methoxyethanol and
21.6 pbw of butanone was used to prepare a printing plate as described in Example 1. The print run achieved was 190,000.

Example 5 (comparative example)

With a solution comprising:
1.5 pbw of a polymer of styrene and monoallyl maleate, (molar ratio 1:1, average molecular weight about 65,000),
0.45 pbw of the diazonium salt polycondensation product of Example 1,
0.09 pbw Viktoriareinblau FGA,
1.5 pbw of the pentaerythritol ester indicated in Example 1,
0.12 pbw of the triazine of Example 1 and
0.04 pbw of phosphoric acid (85%) in
47.7 pbw of 2-methoxyethanol and
48.6 pbw of butanone, a printing plate was prepared as described in Example 1. The completed printing form was used for printing in an offset printing machine. Loss of small half-tone dots and fine line elements rendered this printing form unusable beyond 145,000 prints. A printing plate as per Example 2, which corotated on the same printing machine cylinder, exhibited no damage whatsoever by that point in its printing run.

An identical result was obtained in the comparative printing trial using the light-sensitive layer according to the embodiment of the present invention in Example 3.

Example 6 (comparative example)

A solution was prepared by dissolving
1.5 pbw of the reaction product of an octadecene-/maleic anhydride copolymer with hydroxyethyl methacrylate,
0.45 pbw of the diazonium salt polycondensation product of Example 1,
0.09 pbw of Viktoriareinblau FGA,
1.5 pbw of the pentaerythritol ester of Example 1,
0.12 pbw of the triazine of Example 1 and
0.04 pbw of phosphoric acid (85%) in
47.7 pbw of 2-methoxyethanol and
48.6 pbw of butanone.

The printing form prepared with this solution as described in Example 1 exhibited a similar behavior as the printing form of Example 5, with the styrene/maleic acid half-ester copolymer as binder. The print run was 125,000.

What is claimed is:

1. A light-sensitive mixture comprising:
   (a) from about 5 to 60% by weight of a negative-working light-sensitive diazonium salt polycondensation product comprising repeat units $A-N_2X$ and B that are bonded to one another through intermediate members which are derived from condensable carbonyl compounds, A being the radical of an aromatic diazonium compound which is condensable with formaldehyde and B being the radical of a compound which is free of diazonium groups and which is condensable with the formaldehyde and is selected from an aromatic amine, a phenol, a phenol ether, an aromatic thioether, an aromatic hydrocarbon, an aromatic heterocyclic compound and an organic acid amide,
   (b) from about 10 to 65% by weight of a free radical-polymerizable compound having at least two terminal, ethylenically-unsaturated groups and a boiling point at atmospheric pressure above 100° C.,
   (c) from about 0.05 to 10% by weight of a polymerization initiator which forms free radicals under the action of actinic radiation, and
   (d) from about 5 to 80% by weight a water-insoluble polymeric binder which is soluble in organic solvents and in aqueous alkaline solutions, wherein the binder is a reaction product of (i) an intramolecular anhydride of an organic dicarboxylic or tricarboxylic acid and (ii) a polymer that comprises vinyl alcohol units and that comprises no other functional groups capable of reaction with acid anhydrides.

2. The light-sensitive mixture as claimed in claim 1, wherein the acid anhydride is a compound represented by one of the following formulas:

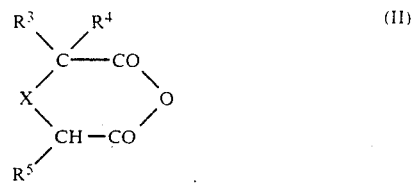

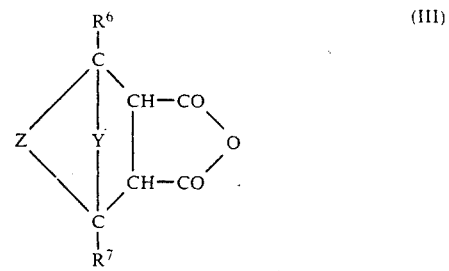

where
$R^1$ and $R^2$ individually denote a hydrogen atom or an alkyl group or together are linked to form an aromatic or heteroaromatic, substituted or unsubstituted 5- or 6-membered ring onto which up to two aromatic or cycloaliphatic rings may be fused, R³, R⁴ and R⁵ individually denote a hydrogen atom or an alkyl group or R³ and R⁵ together are linked to form a substituted or unsubstituted, saturated or unsaturated aliphatic ring, which, including X, can have 5 or 6 ring members, R⁶ and R⁷ each denote a hydrogen atom or an alkyl group, X denotes a single bond, a group selected from a 1,1-alkylene group or a 1,1-cycloalkylene group, which group can be substituted or unsubstituted, an oxygen atom or a sulfur atom, Y denotes an oxygen or sulfur atom, a 1,1- or 1,2-alkylene group or a 1,2-alkenylene group onto which an aromatic or cycloaliphatic ring may be fused, and Z denotes the ring members required for completing a saturated or unsaturated ring, such that up to two aromatic or cycloaliphatic rings can be fused onto said saturated or unsaturated ring.

3. The light-sensitive mixture as claimed in claim 2, wherein R¹ and R² together are linked to form an aromatic or heteroaromatic, substituted or unsubstituted 5- or 6-membered ring onto which up to two aromatic or cycloaliphatic rings are fused, said ring being partially hydrogenated.

4. The light-sensitive mixture as claimed in claim 2, wherein the ring completed by the ring members denoted by Z is substituted.

5. The light-sensitive mixture as claimed in claim 2, wherein the acid anhydride is maleic anhydride, phthalic anhydride, succinic anhydride or 3-oxaglutaric anhydride.

6. The light-sensitive mixture as claimed in claim 1, wherein the hydroxyl-containing synthetic polymer is a polyvinyl acetal having free hydroxyl groups.

7. The light-sensitive mixture of claim 1, wherein said intermediate groups are methylene groups.

8. The light-sensitive mixture as claimed in claim 1, wherein the free radical-polymerizable compound is an acrylic or methacrylic acid ester of a polyhydric alcohol.

9. The light-sensitive mixture as claimed in claim 1, wherein the polymerization initiator is a compound having at least one photolytically cleavable trichloromethyl group.

10. A light-sensitive recording material comprising a base material and a light-sensitive layer applied to the base material, wherein the light-sensitive layer is comprised of a mixture as claimed in claim 1.

11. A light-sensitive mixture according to claim 1, consisting essentially of components a, b, c and d.

12. A light-sensitive mixture according to claim 1, wherein X is mesitylene sulfonate.

13. A light-sensitive mixture according to claim 1, wherein said intermediate groups are methylene.

14. The light-sensitive mixture as claimed in claim 1, wherein the diazonium salt polycondensation product comprises repeat units A—N₂X are derived from compounds of the formula (R⁸—R⁹—)ₚR¹⁰—N₂X, where X denotes the anion of the diazonium compound, P denotes an integer from 1 to 3, R⁸ denotes an aromatic radical having at least one position capable of condensation with active carbonyl compound, R¹⁰ denotes a phenylene group, R⁹ denotes a single bond or one of the following groups:

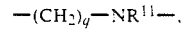

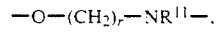

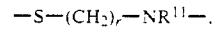

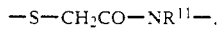

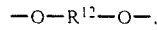

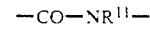

in which q is a number from 0 to 5, r is a number from 2 to 5,

R¹¹ is hydrogen, an alkyl group of 1 to 5 carbon atoms, an aralkyl group of 7 to 12 carbon atoms or an aryl group of 6 to 12 carbon atoms, and R¹² is an arylene group of 6 to 12 carbon atoms.

* * * * *

UNITED STATES PATENT AND TRADEMARK OFFICE
CERTIFICATE OF CORRECTION

PATENT NO. : 5,045,429
DATED : September 3, 1991
INVENTOR(S) : MACK et al.

It is certified that error appears in the above-indentified patent and that said Letters Patent is hereby corrected as shown below:

Column 12, line 18, Claim 14, "P" should read --p--.

Signed and Sealed this

Thirty-first Day of May, 1994

Attest:

BRUCE LEHMAN

*Attesting Officer*        *Commissioner of Patents and Trademarks*